(12) United States Patent
Kim

(10) Patent No.: US 11,527,993 B2
(45) Date of Patent: Dec. 13, 2022

(54) OSCILLATOR CIRCUIT HAVING LOW JITTER AND INSENSITIVITY TO TEMPERATURE CHANGES

(71) Applicant: Samsung Electro-Mechanics Co., Ltd., Suwon-si (KR)

(72) Inventor: Myeung Su Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 17/218,983

(22) Filed: Mar. 31, 2021

(65) Prior Publication Data
US 2022/0166382 A1 May 26, 2022

(30) Foreign Application Priority Data
Nov. 25, 2020 (KR) .................. 10-2020-0160363

(51) Int. Cl.
| | |
|---|---|
| H03B 5/24 | (2006.01) |
| G06F 1/06 | (2006.01) |
| H03K 3/0231 | (2006.01) |
| H03K 3/011 | (2006.01) |
| H03K 4/501 | (2006.01) |

(52) U.S. Cl.
CPC ............. *H03B 5/24* (2013.01); *G06F 1/06* (2013.01); *H03K 3/011* (2013.01); *H03K 3/0231* (2013.01); *H03K 4/501* (2013.01)

(58) Field of Classification Search
CPC . H03B 5/24; H03K 3/03; H03K 3/354; H03K 4/50; H03K 4/501
See application file for complete search history.

(56) References Cited

U.S. PATENT DOCUMENTS

2018/0219536 A1* 8/2018 Lee ................... H03K 3/013

FOREIGN PATENT DOCUMENTS

| KR | 10-2005-0121943 A | 12/2005 |
|---|---|---|
| KR | 10-2012-0122615 A | 11/2012 |

* cited by examiner

*Primary Examiner* — Ryan Johnson
(74) *Attorney, Agent, or Firm* — NSIP Law

(57) ABSTRACT

An oscillator circuit includes an initial level setting circuit configured to operate in an on-state during an initial operation of the oscillator circuit to supply a first level voltage to a first node and a second level voltage to a second node, a switching circuit configured to connect a power supply voltage terminal and a ground terminal to the first or second node in response to first and second clock signals having different phases after the initial operation, a signal generation circuit connected between the first and second nodes and configured to perform charging and discharging operations based on a potential difference between the first and second nodes, and generate first and second voltages determined by the charging and discharging operations, and an inverter circuit configured to generate the first clock signal based on the first voltage, and generate the second clock signal based on the second voltage.

30 Claims, 10 Drawing Sheets

210 and 220 in "on-state"
during initial operation 210 and 220 in "off-state" after initial operation Vc1 or Vc2

OSCILLATOR CIRCUIT HAVING LOW JITTER AND INSENSITIVITY TO TEMPERATURE CHANGES

CROSS-REFERENCE TO RELATED APPLICATIONS

This application claims the benefit under 35 USC 119(a) of Korean Patent Application No. 10-2020-0160363 filed on Nov. 25, 2020, in the Korean Intellectual Property Office, the entire disclosure of which is incorporated herein by reference for all purposes.

BACKGROUND

1. Field

This application relates to an oscillator circuit having a low jitter and insensitivity to temperature changes.

2. Description of Related Art

As the performance of mobile phone camera increases, high-resolution camera modules with high performance and optical image stabilization technology are needed. To this end, a high-resolution analog-digital converter (ADC) is needed. In general, the jitter performance of an oscillator of the ADC should be increased to obtain an ADC having a resolution of 16 bits or more.

Larger image sensors result in larger actuator driving forces, and an ambient temperature change due to the heat of a driver IC is significant. Accordingly, oscillator frequency characteristics need to be less sensitive to temperature changes.

In an inductor sensing method, as opposed to a Hall sensor IC sensing method, the jitter performance and temperature characteristics of a system clock have a great influence on the actuator performance. In addition, in a system using a high-resolution ADC, jitter performance may influence the ADC performance.

Related art oscillators include separate temperature compensation blocks to compensate for temperature changes, and additionally include voltage sources to improve jitter performance.

In such a related art oscillator, the area of the oscillator increases, and a compensator capable of compensating for the temperature characteristics of an oscillator core should be additionally designed.

For example, in a related art oscillator, when the frequency characteristic of the oscillator has a positive direction characteristic in response to a temperature change, temperature compensation is performed by designing the oscillator so that a bias current has a negative direction characteristic in response to the temperature change using an additional temperature compensation circuit.

However, a related art oscillator has a problem in that it may be difficult to obtain accurate compensation characteristics because there is a difference between the design change rate and the actual product change rate. Accordingly, there are disadvantages in that a voltage source for improving jitter performance needs to be additionally provided so that the area of the oscillator is increased.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, an oscillator circuit includes an initial level setting circuit configured to operate in an on-state during an initial operation of the oscillator circuit to supply a first level voltage to a first node and a second level voltage to a second node; a switching circuit configured to connect a power supply voltage terminal and a ground terminal to the first node or the second node in response to a first clock signal and a second clock signal having different phases after the initial operation of the oscillator circuit; a signal generation circuit connected between the first node and the second node and configured to perform a charging operation and a discharging operation based on a potential difference between the first node and the second node, and generate a first voltage and a second voltage determined by the charging operation and the discharging operation; and an inverter circuit configured to generate the first clock signal based on the first voltage, and generate the second clock signal based on the second voltage.

The initial level setting circuit may be further configured to operate in an off-state after the initial operation of the oscillator circuit to not supply the first level voltage to the first node and not supply the second level voltage to the second node.

The initial level setting circuit may include a first initial level setting unit configured to operate in an on-state during the initial operation of the oscillator circuit to supply the first level voltage to the first node; and a second initial level setting unit configured to operate in an on-state during the initial operation of the oscillator circuit to supply the second level voltage to the second node.

The switching circuit may include a first switch configured to alternately connect the power supply voltage terminal to the first node and the second node in response to the first clock signal; and a second switch configured to alternately connect the ground terminal to the second node and the first node in response to the second clock signal.

The first switch and the second switch may be further configured so that the first switch connects the power supply voltage terminal to the first node while the second switch connects the ground terminal to the second node, and the first switch connects the ground terminal to the second node while the second switch connects the power supply voltage terminal to the first node.

The signal generation circuit may include a first RC circuit including a first resistor and a first capacitor connected in series between the first node and the second node to perform a charging operation and a discharging operation based on the potential difference between the first node and the second node, and output the first voltage from an intermediate connection node between the first resistor and the first capacitor; and a second RC circuit including a second capacitor and a second resistor connected in series between the first node and the second node to perform a charging operation and a discharging operation based on the potential difference between the first node and the second node, and output the second voltage from an intermediate connection node between the second capacitor and the second resistor.

A time constant of the first resistor and the first capacitor of the first RC circuit may determine an oscillation frequency of the first clock signal, and a time constant of the second capacitor and the second resistor of the second RC circuit may determine an oscillation frequency of the second clock signal.

The inverter circuit may include a first inverter configured to generate the first clock signal by inverting the first voltage; and a second inverter configured to generate the second clock signal by inverting the second voltage.

The first inverter may be further configured to generate the first clock signal by inverting the first voltage based on a first threshold voltage, the second inverter may be further configured to generate the second clock signal by inverting the second voltage based on a second threshold voltage different from the first threshold voltage, the first threshold voltage may cause the first clock signal to have an on-duty ratio of less than 50%, and the second threshold voltage may cause the second clock signal to have an on-duty ratio of greater than 50%.

In another general aspect, an oscillator circuit includes an initial level setting circuit configured to operate in an on-state in response to a control signal during an initial operation of the oscillator circuit to supply a first level voltage to a first node and a second level voltage to a second node; a switching circuit configured to connect a power supply voltage terminal and a ground terminal to the first node or the second node in response to a first clock signal and a second clock signal having different phases after the initial operation of the oscillation circuit; a signal generation circuit connected between the first node and the second node and configured to perform a charging operation and a discharging operation based on a potential difference between the first node and the second node, and generate a first voltage and a second voltage determined by the charging operation and the discharging operation; an inverter circuit configured to generate the first clock signal based on the first voltage, and generate the second clock signal based on the second voltage; and a control circuit configured to generate the control signal to control the initial level setting circuit to operate in the on-state during the initial operation of the oscillator circuit.

The initial level setting circuit may be further configured to operate in an off-state in response to the control signal after the initial operation of the oscillator circuit to not supply the first level voltage to the first node and not supply the second level voltage to the second node, and the control circuit may be further configured to generate the control signal to control the initial level setting circuit to operate in the off-state after the initial operation of the oscillator circuit.

The initial level setting circuit may include a first initial level setting unit configured to operate in an on-state during the initial operation of the oscillator circuit to supply the first level voltage to the first node; and a second initial level setting unit configured to operate in an on-state during the initial operation of the oscillator circuit to supply the second level voltage to the second node.

The switching circuit may include a first switch configured to alternately connect the power supply voltage terminal to the first node and the second node in response to the first clock signal; and a second switch configured to alternately connect the ground terminal to the second node and the first node in response to the second clock signal.

The first switch and the second switch may be further configured so that the first switch connects the power supply voltage terminal to the first node while the second switch connects the ground terminal to the second node, and the first switch connects the ground terminal to the second node while the second switch connects the power supply voltage terminal to the first node.

The signal generation circuit may include a first RC circuit including a first resistor and a first capacitor connected in series between the first node and the second node to perform a charging operation and a discharging operation based on a potential difference between the first node and the second node, and output the first voltage from an intermediate connection node between the first resistor and the first capacitor; and a second RC circuit including a second capacitor and a second resistor connected in series between the first node and the second node to perform a charging operation and a discharging operation based on the potential difference between the first node and the second node, and output the second voltage from an intermediate connection node between the second capacitor and the second resistor.

A time constant of the first resistor and the first capacitor of the first RC circuit may determine an oscillation frequency of the first clock signal, and a time constant of the second capacitor and the second resistor of the second RC circuit may determine an oscillation frequency of the second clock signal.

The inverter circuit may include a first inverter configured to generate the first clock signal by inverting the first voltage; and a second inverter configured to generate the second clock signal by inverting the second voltage.

The first inverter may be further configured to generate the first clock signal by inverting the first voltage based on a first threshold voltage, the second inverter may be further configured to generate the second clock signal by inverting the second voltage based on a second threshold voltage different from the first threshold voltage, the first threshold voltage may cause the first clock signal to have an on-duty ratio of less than 50%, and the second threshold voltage may cause the second clock signal to have an on-duty ratio of greater than 50%.

In another general aspect, a oscillator circuit includes an initial level setting circuit configured to supply a first level voltage to a first node and a second level voltage to a second node during an initial operation of the oscillator circuit; a switching circuit configured to periodically switch between a first configuration in which a power supply voltage terminal is connected to the first node and a ground terminal is connected to the second node and a second configuration in which the power supply terminal is connected to the second node and the ground terminal is connected to the first node in response to a first clock signal and a second clock signal having different phases after the initial operation of the oscillator circuit; a signal generation circuit connected between the first node and the second node and configured to generate a first voltage and a second voltage that vary over time based on a potential difference between the first node and the second node; and an inverter circuit configured to generate the first clock signal based on the first voltage, and generate the second clock signal based on the second voltage.

The initial level setting circuit may be further configured not to supply any voltage to the first node and the second node after the initial operation of the oscillator circuit, and the switching circuit may include a first switch configured to alternate between connecting the power supply voltage terminal to the first node and connecting the power supply voltage terminal to the second node in response to the first clock signal after the initial operation of the oscillator circuit; and a second switch configured to alternate between connecting the ground terminal to the second node while the first switch is connecting the power supply voltage terminal to the first node and connecting the ground terminal to the first node while the first switch is connecting the power supply voltage terminal to the second node in response to the second clock signal after the initial operation of the oscillator circuit.

The signal generation circuit may be further configured to generate the first voltage and the second voltage so that the first voltage and the second voltage vary over time in opposite directions.

The signal generation circuit may include a first RC circuit including a first resistor and a first capacitor connected in series at a first intermediate connection node from which the first voltage is output with the first resistor being connected to the first node and the first capacitor being connected to the second node so the first voltage increases over time based on the potential difference between the first node and the second node while the switching circuit is in the first configuration, and decreases over time based on the potential difference between the first node and the second node while the switching circuit is in the second configuration; and a second RC circuit including a second capacitor and a second resistor connected in series at a second intermediate node between the first node and the second node from which the second voltage is output with the second capacitor being connected to the first node and the second resistor being connected to the second node so the second voltage decreases over time based on the potential difference between the first node and the second node while the switching circuit is in the first configuration, and increases over time based on the potential difference between the first node and the second node while the switching circuit is in the second configuration.

The inverter circuit may include a first inverter configured to generate the first clock signal by inverting the first voltage based on a threshold voltage Vth, and a second inverter configured to generate the second clock signal by inverting the second voltage based on the threshold voltage Vth.

The threshold voltage Vth may cause the first clock signal and the second clock signal to have an on-duty ratio of 50%.

The inverter circuit may include a first inverter having a threshold voltage Vth and being configured to generate the first clock signal by inverting the first voltage based on a first threshold voltage Vth−(Vos/2), where Vos is an offset voltage of the inverter circuit; and a second inverter having the threshold voltage Vth and being configured to generate the second clock signal by inverting the second voltage based on a second threshold voltage Vth+(Vos/2).

The first threshold voltage Vth−(Vos/2) may cause the first clock signal to have an on-duty ratio of less than 50%, and the second threshold voltage Vth+(Vos/2) may cause the second clock signal to have an on-duty ratio of greater than 50%.

In another general aspect, an oscillator circuit includes an initial level setting circuit configured to supply a first level voltage to a first node and a second level voltage to a second node during an initial operation of the oscillator circuit; a switching circuit configured to periodically switch between a first configuration in which a power supply voltage terminal is connected to the first node and a ground terminal is connected to the second node and a second configuration in which the power supply terminal is connected to the second node and the ground terminal is connected to the first node in response to a first clock signal and a second clock signal having different phases after the initial operation of the oscillator circuit; a signal generation circuit connected between the first node and the second node and configured to generate a first voltage and a second voltage based on a potential difference between the first node and the second node; and an inverter circuit configured to generate the first clock signal based on the first voltage, and generate the second clock signal based on the second voltage, wherein the first voltage and the second voltage vary over time by a fixed amount regardless of whether the inverter circuit has an offset voltage.

The inverter circuit may not have an offset voltage, and may include a first inverter configured to generate the first clock signal by inverting the first voltage based on a threshold voltage Vth, and a second inverter configured to generate the second clock signal by inverting the second voltage based on the threshold voltage Vth.

The inverter circuit may have an offset voltage Vos and may include a first inverter having a threshold voltage Vth and being configured to generate the first clock signal by inverting the first voltage based on a first threshold voltage Vth−(Vos/2); and second inverter having the threshold voltage Vth and being configured to generate the second clock signal by inverting the second voltage based on a second threshold voltage Vth+(Vos/2).

The power supply terminal may be configured to receive a power supply voltage, the ground terminal may be configured to receive a ground potential, and the first voltage and the second voltage may vary over time by a fixed amount equal to twice the power supply voltage regardless of whether the inverter circuit has an offset voltage.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
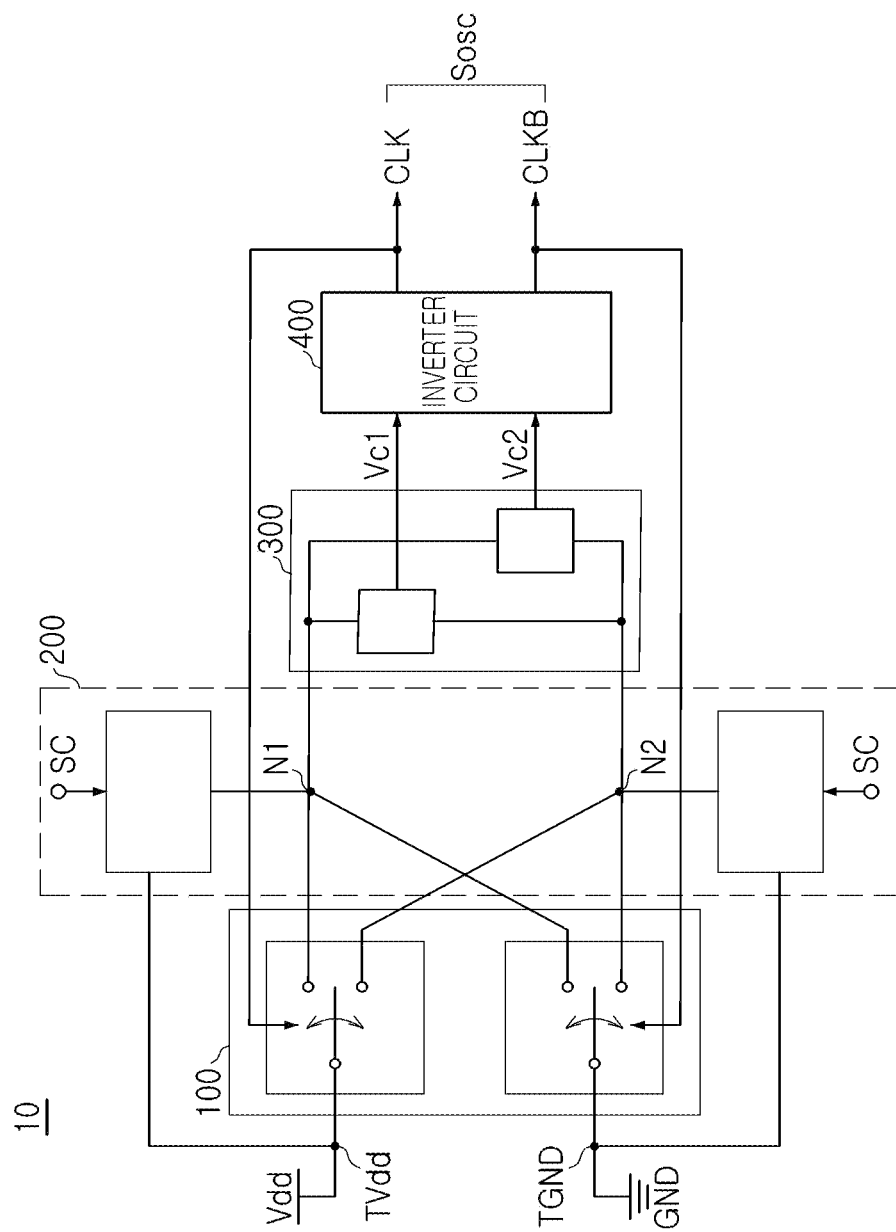
FIG. 1 is a diagram illustrating an example of an oscillator circuit.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. The sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Use herein of the word "may" in describing the various examples, e.g., as to what an example may include or implement, means that at least one example exists in which such a feature is included or implemented while all examples are limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated by 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape occurring during manufacturing.

The features of the examples described herein may be combined in various manners as will be apparent after an understanding of the disclosure of this application. Further, although the examples described herein have a variety of configurations, other configurations are possible as will be apparent after an understanding of the disclosure of this application.

Figure 2:
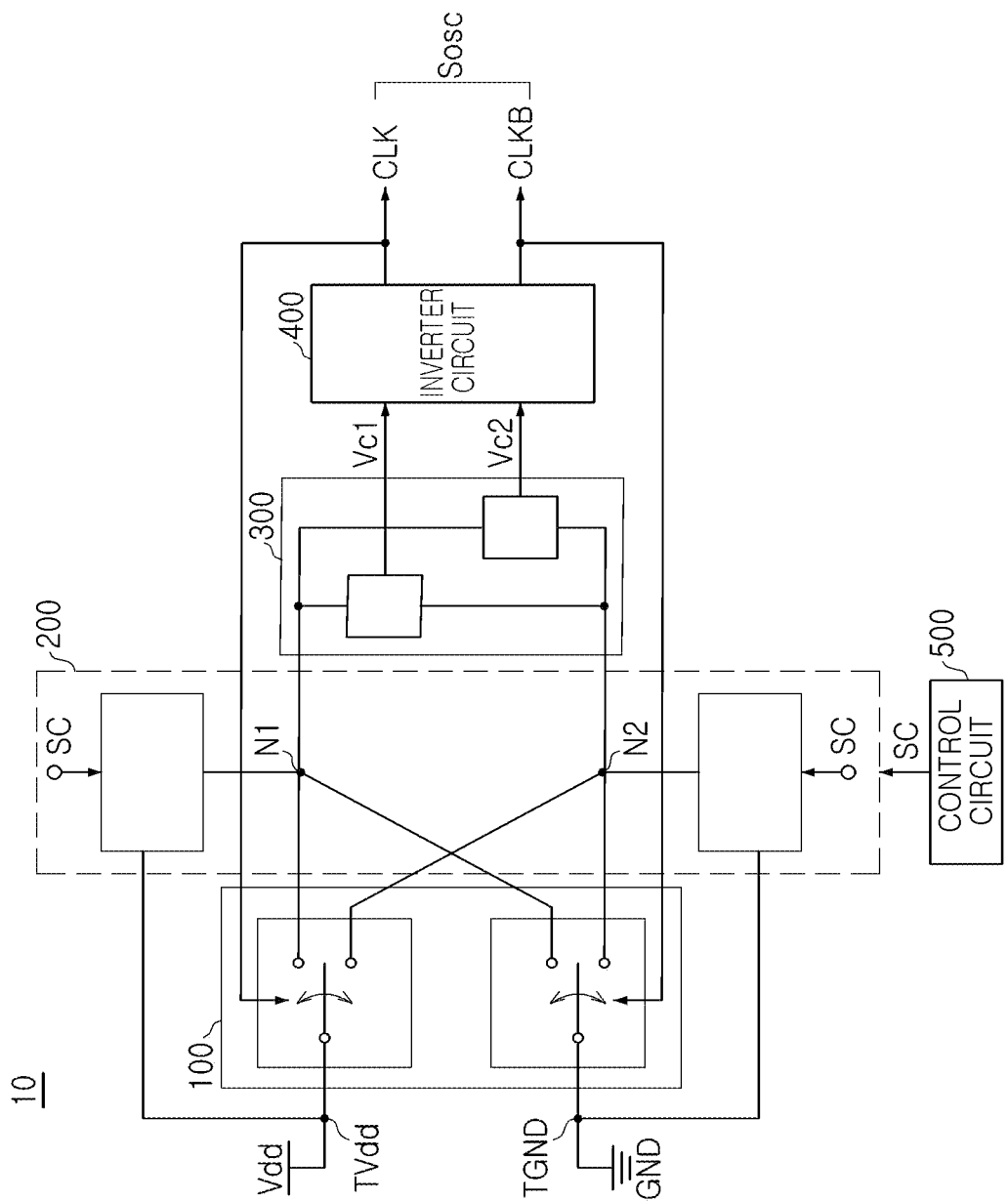
FIG. 2 is a diagram illustrating another example of an oscillator circuit.

FIG. 1 is a diagram illustrating an example of an oscillator circuit, and FIG. 2 is a diagram illustrating another example of an oscillator circuit.

Referring to FIGS. 1 and 2, an oscillator circuit 10 may include a switching circuit 100, an initial level setting circuit 200, a signal generation circuit 300, and an inverter circuit 400.

The switching circuit 100 may connect a power supply voltage terminal TVdd and a ground terminal TGND to a first node N1 or a second node N2 based on a first clock signal CLK and a second clock signal CLKB having different phases. For example, the switching circuit 100 may alternately connect the power supply voltage terminal TVdd to the first node N1 and the second node N2 in response to the first clock signal CLK, and may alternately connect the ground terminal TGND to the second node N2 and the first node N1 in response to the second clock signal CLKB. The switching circuit 100 may connect the power supply voltage terminal TVdd to the first node N1 while the switching circuit 100 connects the ground terminal TGND to the second node N2, and may connect the power supply voltage terminal TVdd to the second node N2 while the switching circuit 100 connects the ground terminal TGND to the first node N1.

The initial level setting circuit 200 operates in response to a control signal SC.

In particular, the initial level setting circuit 200 operates in an on-state during an initial operation of the oscillator circuit 10 in response to the control signal SC. While operating in the on-state, the initial level setting circuit 200 supplies a first level voltage (e.g., a power supply voltage Vdd) to the first node N1, and supplies a second level voltage (e.g., a ground potential GND) to the second node N2.

In addition, the initial level setting circuit 200 operates in an off-state after the initial operation of the oscillator circuit 10 in response to the control signal SC. While operating in the off-state, the initial level setting circuit 200 does not supply the first level voltage to the first node N1, and does not supply the second level voltage to the second node N2.

The signal generation circuit 300 may be connected between the first node N1 and the second node N2, may perform a charging operation and a discharging operation based on a potential difference between the first node N1 and the second node N2, and may generate a first voltage Vc1 and a second voltage Vc2 determined by the charging operation and the discharging operation.

In addition, the inverter circuit 400 may generate the first clock signal CLK based on the first voltage Vc1, generate the second clock signal CLKB based on the second voltage Vc2, and output an oscillation signal Sosc including either one or both of the first and second clock signals CLK and CLKB.

For example, the inverter circuit 400 may invert the first voltage Vc1 to generate the first clock signal CLK, and may invert the second voltage Vc2 to generate the second clock signal CLKB.

Referring to FIG. 2, the oscillator circuit 10 may further include a control circuit 500.

For example, during the initial operation of the oscillator circuit 10, the control circuit 500 may output a control signal SC for controlling the initial level setting circuit 200 to operate in the on-state to the initial level setting circuit 200, and after the initial operation of the oscillator circuit 10, the control circuit 500 may output a control signal SC for controlling the initial level setting circuit 200 to operate in the off-state to the initial level setting circuit 200.

For example, the control signal SC may have a high level during the initial operation of the oscillator circuit, and may have a low level after the initial operation of the oscillator circuit 10, but the configuration of the control signal SC is not limited thereto.

In the following description, redundant descriptions of components in the drawings having the same reference numerals and same functions may be omitted, and only differences between the drawings may be described.

Figure 3:
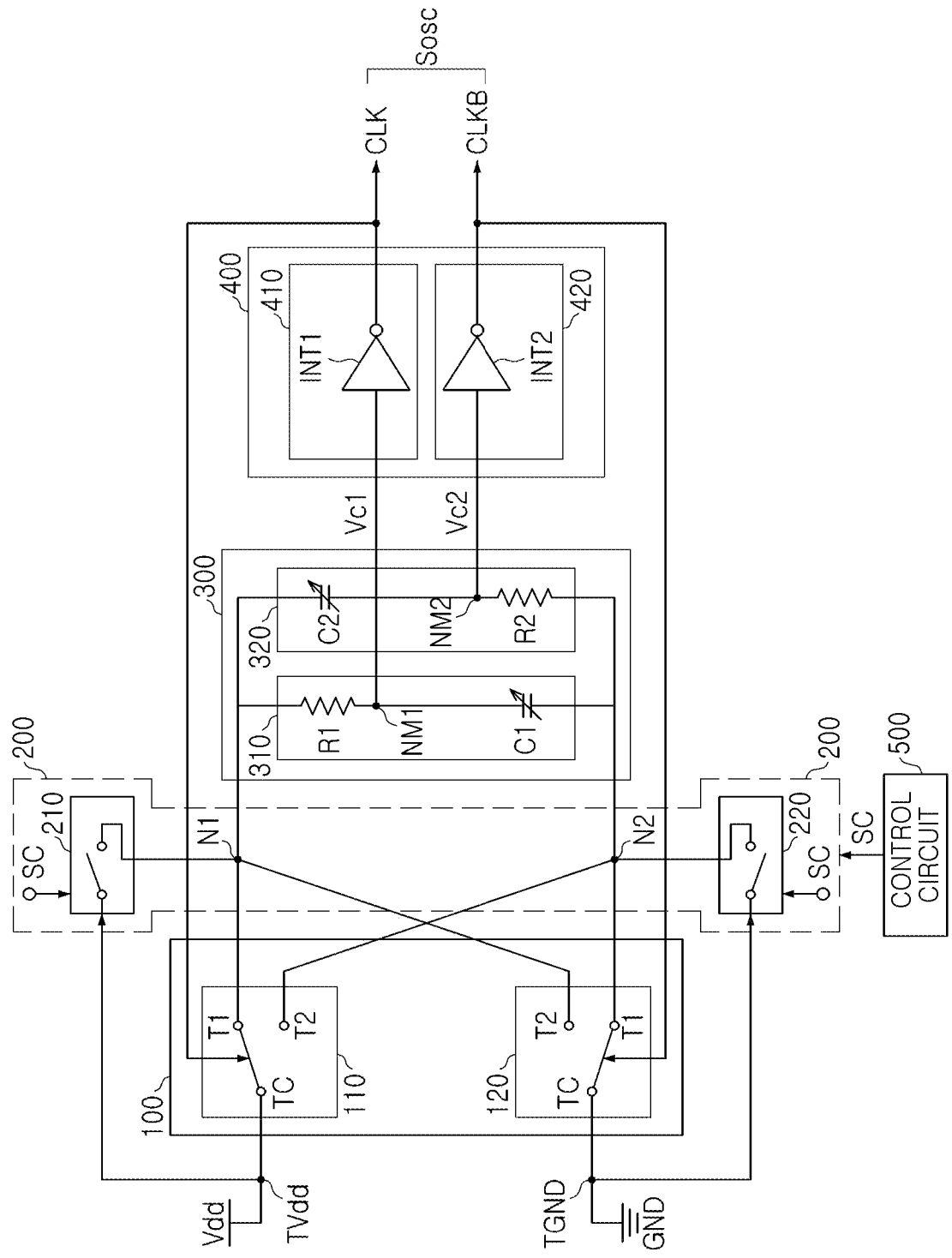
FIG. 3 is a diagram illustrating an example of an internal circuit of the oscillator circuit of FIG. 2 in which an inverter circuit does not have an offset voltage.
Figure 4:
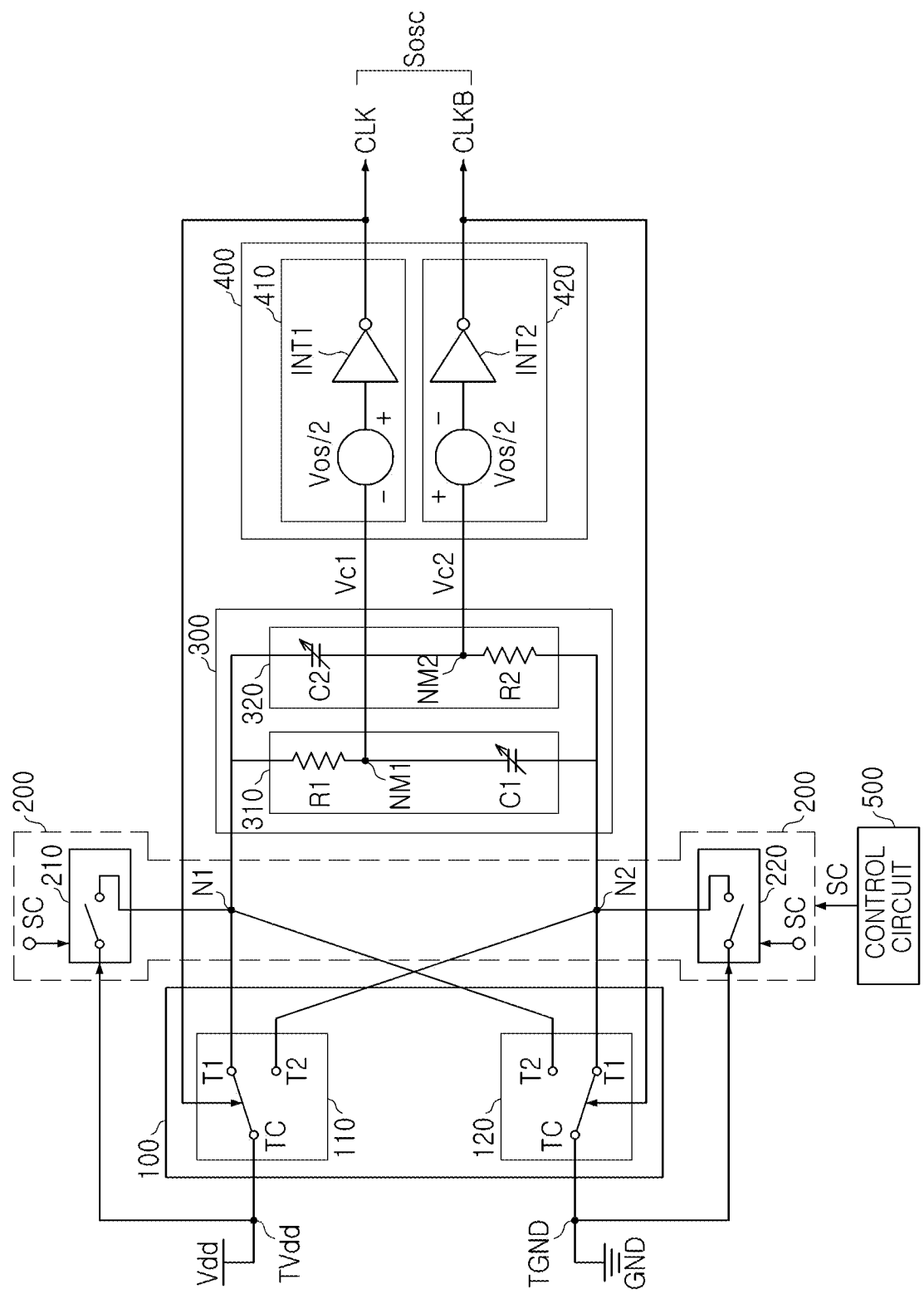
FIG. 4 is a diagram illustrating another example of an internal circuit of the oscillator circuit of FIG. 2 in which an inverter circuit has an offset voltage.

FIG. 3 is a diagram illustrating an example of an internal circuit of the oscillator circuit of FIG. 2 in which an inverter circuit does not have an offset voltage, and FIG. 4 is a diagram illustrating another example of an internal circuit of the oscillator circuit of FIG. 2 in which an inverter circuit has an offset voltage.

Referring to FIGS. 3 and 4, the switching circuit 100 may include a first switch 110 and a second switch 120.

The first switch 110 may alternately connect the power supply voltage terminal TVdd to the first node N1 and the second node N2 based on the first clock signal CLK.

For example, the first switch 110 may connect a common terminal TC of the first switch 110 connected to the power supply voltage terminal TVdd to one of a first terminal T1 of the first switch 110 connected to the first node N1 and a second terminal T2 of the first switch 110 connected to the second node N2. For example, when the first clock signal CLK has a high level, the first switch 110 may connect the common terminal TC of the first switch 110 to the first node N1, and when the first clock signal CLK has a low level, the first switch 110 may connect the common terminal TC of the first switch 110 to the second node N2, but the configuration of the first switch 110 is not limited thereto.

The second switch 120 may alternatively connect the ground terminal TGND to the first node N1 and the second node N2 based on the second clock signal CLKB.

For example, the second switch 120 may connect a common terminal TC of the second switch 120 connected to the ground terminal TGND to one of a first terminal T1 of the second switch 120 connected to the first node N1 and a second terminal T2 of the second switch 120 connected to the second node N2. For example, when the second clock signal CLKB has a high level, the second switch 120 may connect the common terminal TC of the second switch 120 to the first node N1, and when the second clock signal CLKB has a low level, the second switch 120 may connect the common terminal TC of the second switch 120 to the second node N2, but the configuration of the second switch 120 is not limited thereto.

The initial level setting circuit 200 may include a first initial level setting unit 210 and a second initial level setting unit 220.

The first initial level setting unit 210 may operate in an on-state during the initial operation in response to the control signal SC to supply the first voltage to the first node N1. The second initial level setting unit 220 may operate in an on-state during the initial operation in response to the control signal SC to supply a second level voltage to the second node N2.

For example, during the initial operation of the oscillator circuit 10, when the control signal SC has a high level, the first initial level setting unit 210 and the second initial level setting unit 220 may operate in the on-state, and after the initial operation of the oscillator circuit 10, when the control signal SC has a low level, the first initial level setting unit 210 and the second initial level setting unit 220 may operate in the off-state.

For example, the control signal SC may be set to a high level during the operation of the oscillator circuit 10, and may be set to a low level after the initial operation of the oscillator circuit 10, but the configuration of the control signal SC is not limited thereto.

The signal generation circuit 300 may include a first RC circuit 310 and a second RC circuit 320.

The first RC circuit 310 includes a first resistor R1 and a first capacitor C1 connected in series between the first node N1 and the second node N2, and may output the first voltage Vc1 from an intermediate connection node NM1 between the first resistor R1 and the first capacitor C1 by performing a charging operation or a discharging operation based on a potential difference between the node N1 and the second node N2.

The second RC circuit 320 may include a second capacitor C2 and a second resistor R2 connected in series between the first node N1 and the second node N2, and may output the second voltage Vc2 from an intermediate connection node NM2 between the second capacitor C2 and the second resistor R2 by performing a charging operation or a discharging operation based on the potential difference between the node N1 and the second node N2.

The first RC circuit 310 and the second RC circuit 320 differ from each other in the way the first resistor R1, the first capacitor C1, the second capacitor C2, and the second resistor R2 are connected to the first node N1 and the second node N2. In particular, in the first RC circuit 310, the first resistor R1 is connected to the first node N1 and the first capacitor C1 is connected to the second node N2, while in the second RC circuit 320, the second capacitor C2 is connected to the first node N1 and the second resistor R1 is connected to the second node N2. Accordingly, the first voltage Vc1 and the second voltage Vc2 change differently.

For example, the first RC circuit 310 may determine the oscillation frequency of the first clock signal CLK according to the time constant of the first resistor R1 and the first capacitor C1. For example, at least one of the first resistor R1 and the first capacitor C1 may be a variable element for varying the oscillation frequency of the first clock signal CLK. In the example illustrated in FIG. 3, the first capacitor C1 is a variable element.

The second RC circuit 320 may determine the oscillation frequency of the second clock signal CLKB according to the time constant of the second resistor R2 and the second capacitor C2. For example, at least one of the second resistor R2 and the second capacitor C2 may be a variable element for varying the oscillation frequency of the second clock signal CLKB. In the example illustrated in FIG. 3, the second capacitor C2 is a variable element.

For example, the first capacitor C1 and the second capacitor C2 may have the same capacitance value, but are not limited thereto.

The inverter circuit 400 may include a first inverter 410 and a second inverter 420.

Referring to FIG. 3, the first inverter 410 may generate the first clock signal CLK by inverting the first voltage Vc1. For example, the first inverter 410 may include a first inverter element INT1 that may generate the first clock signal CLK by inverting the first voltage Vc1 based on a threshold voltage Vth.

The second inverter 420 may generate the second clock signal CLKB by inverting the second voltage Vc2. For example, the second inverter 420 may include a second inverter element INT2 that may generate the second clock signal CLKB by inverting the second voltage Vc2 based on the threshold voltage Vth.

Thus, the first inverter 410 and the second inverter 420 may have the same threshold voltage Vth. Accordingly, the threshold voltage Vth may cause the first clock signal CLK and the second clock signal CLKB to each have an on-duty ratio of 50%.

FIG. 3 represents a case in which the inverter circuit 400 does not have an offset voltage Vos between the threshold voltage Vth of the first inverter 410 and the threshold voltage Vth of the second inverter 420. On the other hand, when the inverter circuit 400 does have an offset voltage Vos, the inverter circuit 400 may be represented as illustrated in FIG. 4 to take into account the influence of the offset voltage Vos.

Referring to FIG. 4, Vos is an offset voltage of the inverter circuit 400. The first inverter 410 may include the first inverter element INT1 having the threshold voltage Vth, and a first imaginary voltage source generating a voltage of −(Vos/2). The second inverter 420 may include the second inverter element INT2 having the threshold voltage Vth, and a second imaginary voltage source generating a voltage of +(Vos/2). The first imaginary voltage source and the second imaginary voltage source account for the influence of the offset voltage Vos.

The first inverter 410 may generate the first clock signal CLK by inverting the first voltage Vc1 based on a first threshold voltage Vth−(Vos/2) equal to the threshold voltage Vth minus one half of the offset voltage Vos of the inverter circuit 400.

The second inverter 420 may generate the second clock signal CLKB by inverting the second voltage Vc2 based on a second threshold voltage Vth+(Vos/2) equal to the threshold voltage Vth plus one half of the offset voltage Vos of the inverter circuit 400.

Accordingly, the first threshold voltage Vth−(Vos/2) and the second threshold voltage Vth+(Vos/2) are separated by the offset voltage Vos of the inverter circuit 400, and the first threshold voltage Vth−(Vos/2) may cause the first clock signal CLK to have an on-duty ratio of less than 50%, and the second threshold voltage Vth+(Vos/2) may cause the second clock signal CLKB to have an on-duty ratio of greater than 50%.

In the above description, the threshold voltage Vth is the threshold voltage of the first inverter element INT1 and the second inverter element INT2 themselves, and the first threshold voltage Vth−(Vos/2) and the second threshold voltage Vth+(Vos/2) are the threshold voltages of the first inverter 410 and the second inverter 420.

Figure 5A:
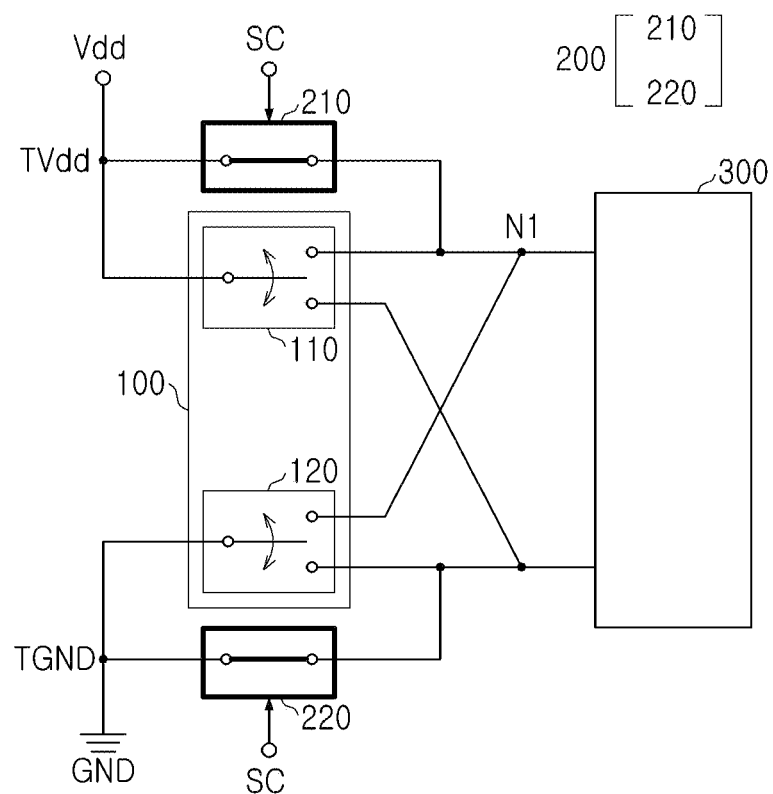
FIGS. 5A and 5B are diagrams illustrating operating states of an initial level setting circuit of FIGS. 3 and 4.
Figure 5B:
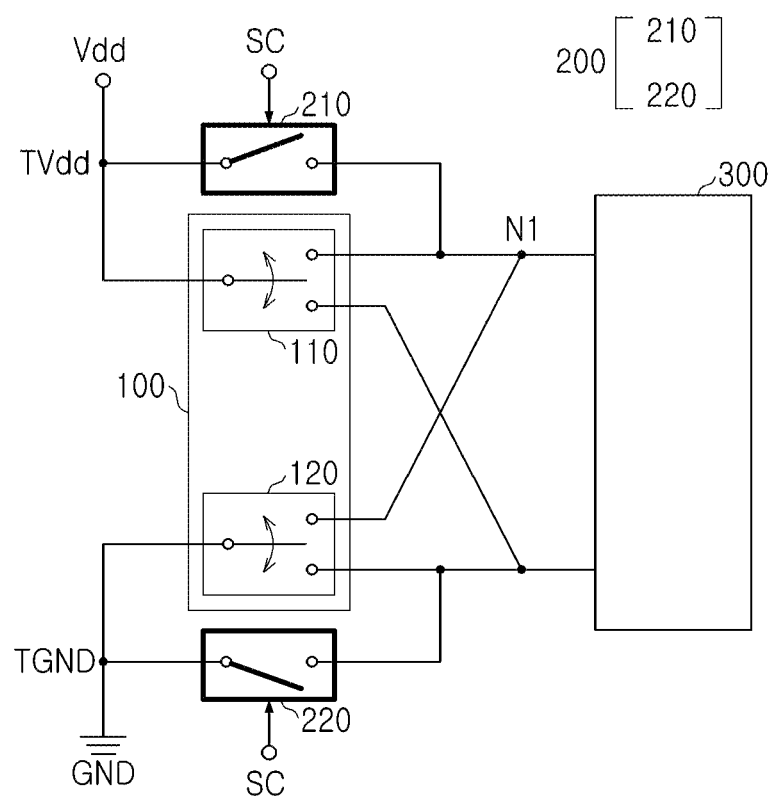

FIGS. 5A and 5B are diagrams illustrating operating states of an initial level setting circuit of FIGS. 3 and 4.

FIG. 5A is a diagram illustrating the first initial level setting unit 210 and the second initial level setting unit 220 of the initial level setting circuit 200 in an on-state, and FIG. 5B is a diagram illustrating the first initial level setting unit 210 and the second initial level setting unit 220 of the initial level setting circuit 200 in an off-state.

Referring to FIG. 5A, when the first initial level setting unit 210 and the second initial level setting unit 220 operate in the on-state in response to the control signal SC during the initial operation of the oscillator circuit 10, the potential of the first node N1 may be the power supply voltage Vdd, and the potential of the second node N2 may be the ground potential.

Accordingly, the potentials of the first node N1 and the second node N2 may be set during the initial operation of the oscillator circuit 10, and thus, a stable operation may be started at the beginning of the operation.

Referring to FIG. 5B, when the first initial level setting unit 210 and the second initial level setting unit 220 operate in the off-state in response to the control signal SC after the initial operation of the oscillator circuit 10, the potential of the first node N1 and the potential of the second node N2 may be determined according to the operation of the first switch 110 and the second switch 120 of the switching circuit 100.

Figure 6:
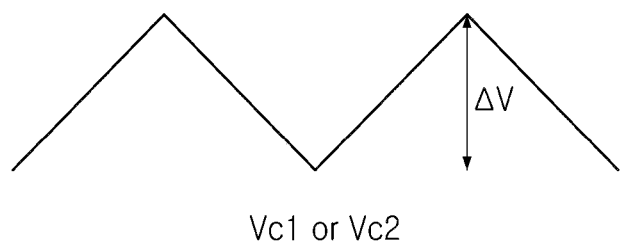
FIG. 6 is a diagram illustrating an example of a variation in a magnitude of a first voltage or a second voltage of FIG. 3 and FIG. 4.

FIG. 6 is a diagram illustrating an example of variations in a magnitude of a first voltage or a second voltage of FIGS. 3 and 4.

Referring to FIG. 6, when the first voltage Vc1 or the second voltage Vc2 changes by ΔV as illustrated in FIG. 6, an amount of jitter may be expressed by Equation 1 below.

$$\text{Jitter amount} \propto (\text{fixed circuit noise}/\Delta V) \tag{1}$$

Referring to Equation 1, it can be seen that the amount of jitter is proportional to the fixed circuit noise such as input offset noise or other noise, and is inversely proportional to the change ΔV in the voltage Vc1 or Vc2. Accordingly, when the change ΔV in the voltage Vc1 or Vc2 decreases, a problem in which the amount of jitter increases may occur. Thus, it can be seen that preventing a decrease in the change ΔV will prevent an increase in the amount of jitter.

Focusing on this point, to prevent the change ΔV in the voltage Vc1 or Vc2 from decreasing, a signal generation circuit including an RC oscillator circuit may be implemented, and an increase in the amount of jitter may be prevented by employing the concept of switching the power supply voltage of the signal generation circuit as described below.

Figure 7A:
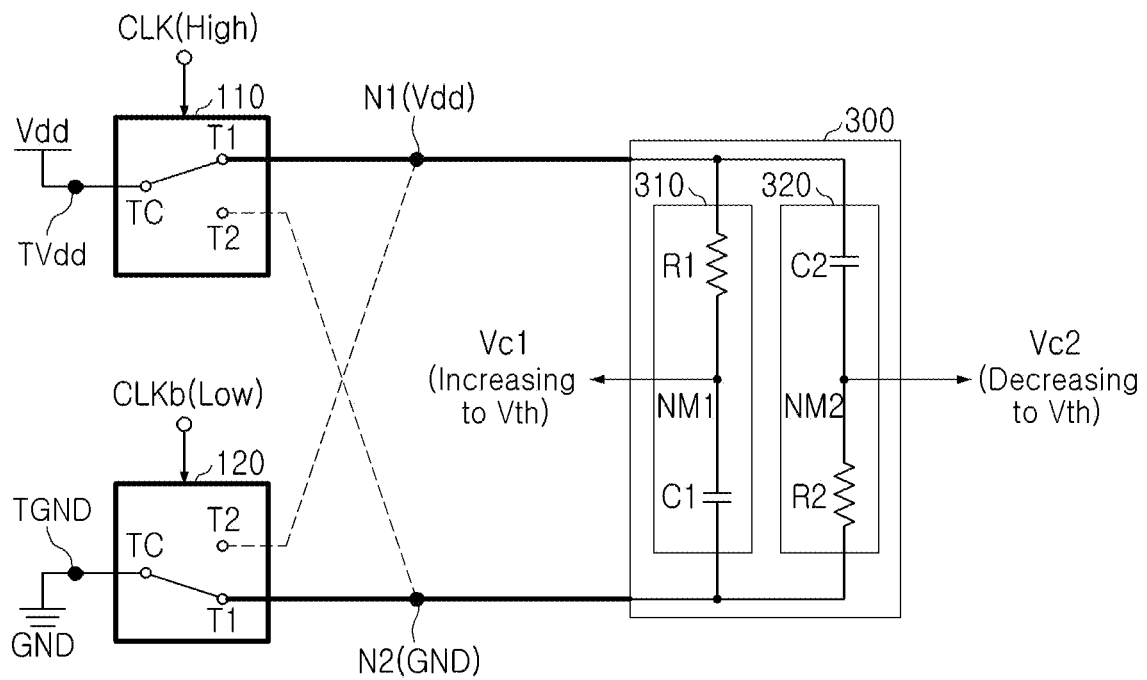
FIGS. 7A and 7B are diagrams illustrating operating states of a switching circuit of FIGS. 3 and 4.
Figure 7B:
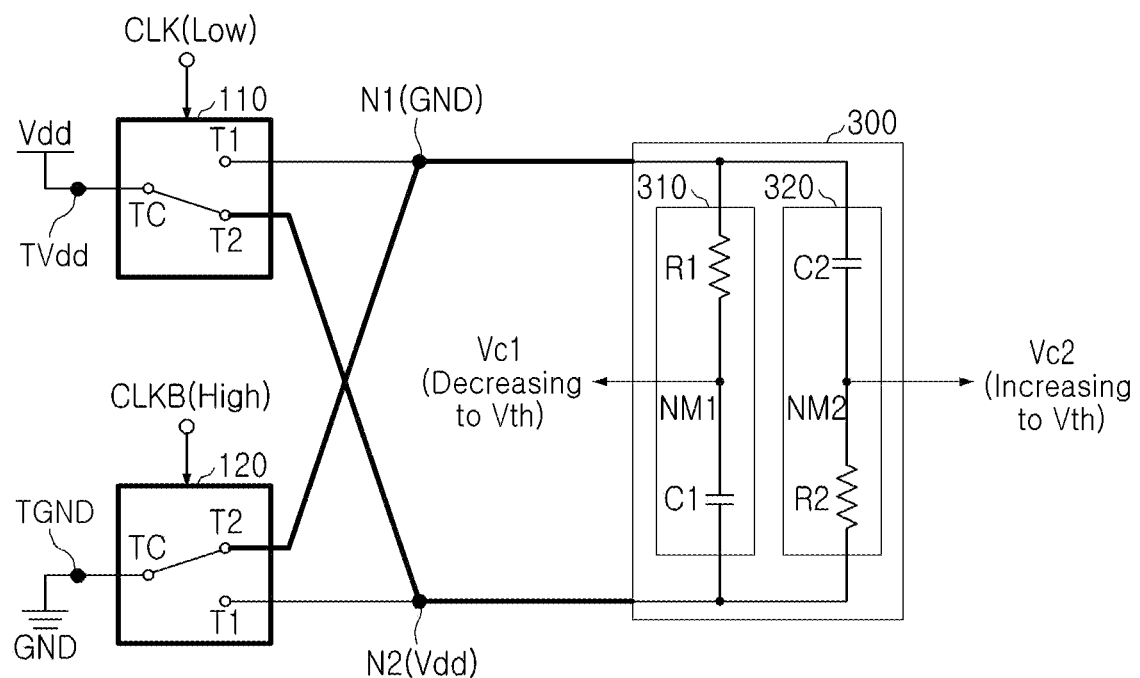

FIGS. 7A and 7B are diagrams illustrating operating states of a switching circuit of FIGS. 3 and 4.

FIG. 7A is a diagram illustrating a state in which the power supply voltage terminal TVdd is connected to the first node N1 by the first switch 110 of the switching circuit 100, and the ground terminal TGND is connected to the second node N2 by the second switch 120 of the switching circuit 100.

Referring to FIG. 7A, the potential of the first node N1 becomes the power supply voltage Vdd and the potential of the second node N2 becomes the ground potential GND, and thus the first RC circuit 310 including the first resistor R1 and the first capacitor C1 connected in series between the first node N1 and the second node N2 may output the first voltage Vc1 increasing to the threshold voltage Vth as shown in FIG. 7A or the first threshold voltage Vth−(Vos/2)

(not shown) from the intermediate connection node NM1 between the first resistor R1 and the first capacitor C1.

Also, the second RC circuit 320 including the second capacitor C2 and the second resistor R2 connected in series between the first node N1 and the second node N2 may output the second voltage Vc2 decreasing to the threshold voltage Vth as shown in FIG. 7A or the second threshold voltage Vth+(Vos/2) (not shown) from the intermediate connection node NM2 between the second capacitor C2 and the second resistor R2.

FIG. 7B is a diagram illustrating a state in which the power supply voltage terminal TVdd is connected to the second node N2 by the first switch 110 of the switching circuit 100, and the ground terminal TGND is connected to the first node N1 by the second switch 120 of the switching circuit 100.

Referring to FIG. 7B, the potential of the first node N1 becomes the ground potential GND and the potential of the second node N2 becomes the power supply voltage Vdd, and thus the first RC circuit 310 may output the first voltage Vc1 decreasing to the threshold voltage Vth as shown in FIG. 7B or the first threshold voltage Vth−(Vos/2) (not shown) from the intermediate connection node NM1 between the first resistor R1 and the first capacitor C1.

Also, the second RC circuit 320 may output the second voltage Vc2 increasing to the threshold voltage Vth as shown in FIG. 7A or the second threshold voltage Vth+(Vos/2) (not shown) from the intermediate connection node NM2 between the second capacitor C2 and the second resistor R2.

Figure 8:
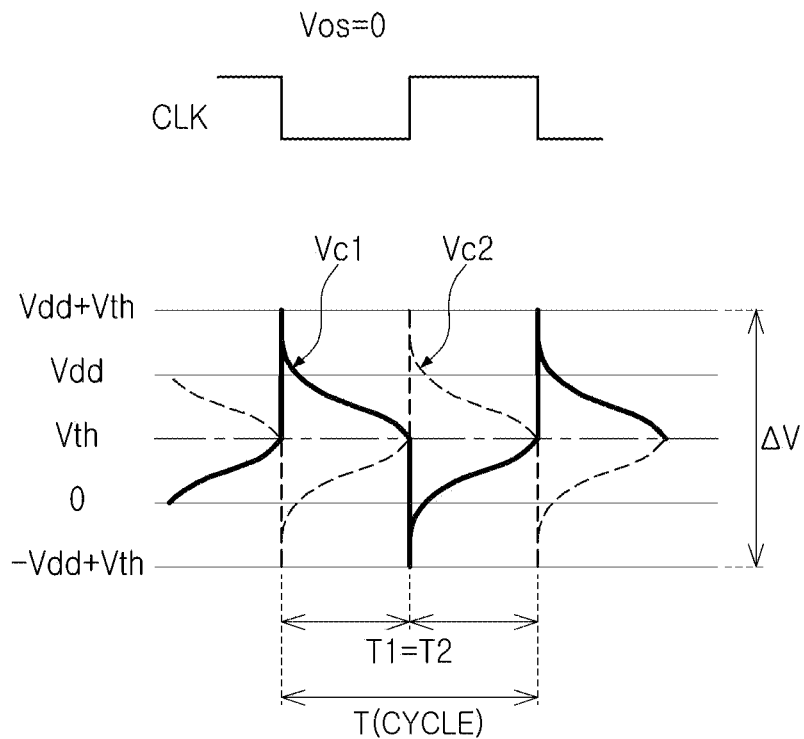
FIG. 8 is a diagram illustrating an operation of a signal generation circuit of FIG. 3 in which the inverter circuit does not have an offset voltage.

FIG. 8 is a diagram illustrating an operation of a signal generating circuit of FIG. 3 in which the inverter circuit does not have an offset voltage.

Referring to FIG. 8, in the case in which the inverter circuit 400 does not have an offset voltage Vos, a level transition to a high level or a low level based on the threshold voltage Vth may occur in the first inverter 410 and the second inverter 420.

Accordingly, when the first clock signal CLK has a high level, the first voltage Vc1 gradually increases to the threshold voltage Vth, and when the first clock signal CLK transitions to the low level, the first voltage Vc1 immediately rises to "power supply voltage+threshold voltage" (Vdd+Vth), and then gradually decreases to the threshold voltage Vth during a first half-cycle period T1.

Subsequently, when the first clock signal CLK transitions to the high level, the first voltage Vc1 immediately falls to "negative power supply voltage+threshold voltage" (−Vdd+Vth), and then gradually increases to the threshold voltage Vth during a second half-cycle period T2.

Also, when the first clock signal CLK has a high level, the second voltage Vc2 gradually decreases to the threshold voltage Vth, and when the first clock signal CLK transitions to the low level, the second voltage Vc2 immediately falls to "negative power supply voltage+threshold voltage" (−Vdd+Vth), and then gradually increases to the threshold voltage Vth during the first half-cycle period T1.

Subsequently, when the first clock signal CLK transitions to the high level, the second voltage Vc2 immediately rises to "power supply voltage+threshold voltage" (Vdd+Vth), and then gradually decreases to the threshold voltage Vth during the second half-cycle period T2.

The operation for one cycle (T=T1+T2) as described above may be repeatedly performed, and in this case, the change ΔV of each of the first voltage Vc1 and the second voltage Vc2 is 2Vdd.

Figure 9:
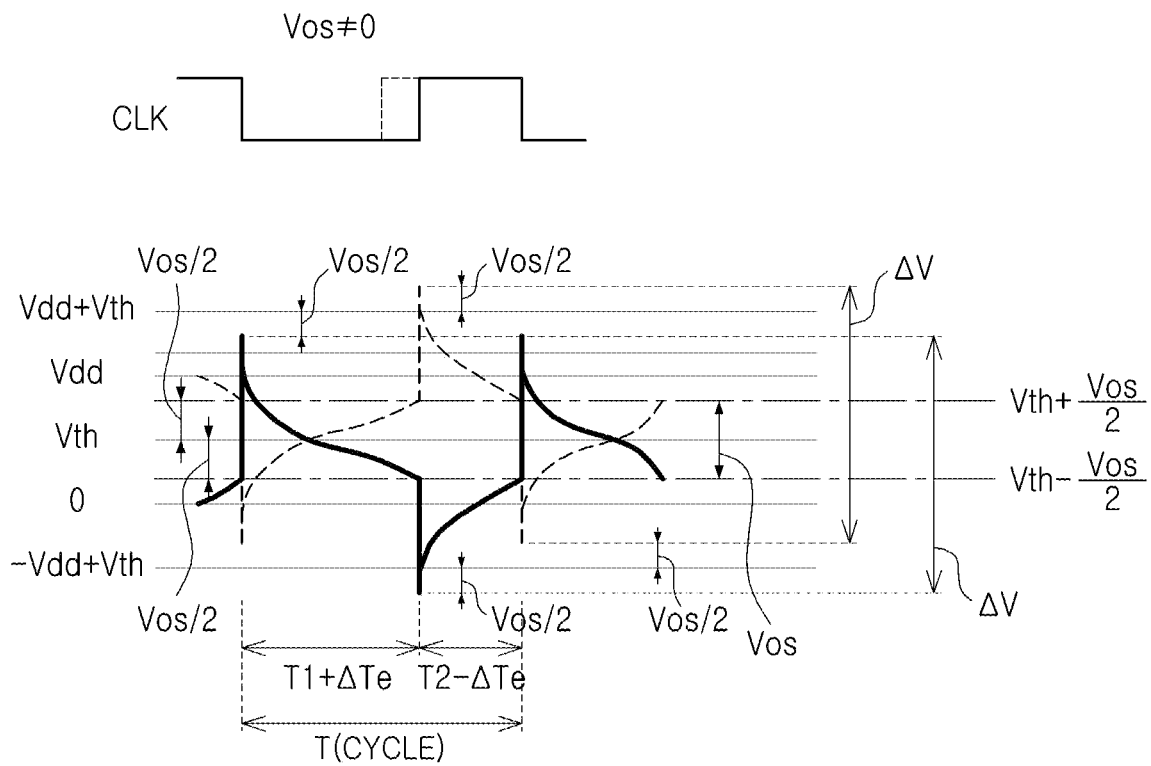
FIG. 9 is a diagram illustrating an operation of a signal generation circuit of FIG. 4 in which the inverter circuit has an offset voltage.

FIG. 9 is a diagram illustrating an operation of a signal generation circuit of FIG. 4 in which the inverter circuit has an offset voltage.

Referring to FIG. 9, the case of FIG. 9 is different from the case of FIG. 8 in that in the case in which the inverter circuit 400 has the offset voltage Vos, a level transition to a high level or a low level based on the first threshold voltage Vth−(Vos/2) may occur in the first inverter 410, and a level transition to a high level or a low level based on the second threshold voltage Vth+(Vos/2) may occur in the second inverter 420.

Accordingly, when the first clock signal CLK has a high level, the first voltage Vc1 gradually increases to the first threshold voltage Vth−(Vos/2), and when the first clock signal CLK transitions to the low level, the first voltage Vc1 immediately rises to "power supply voltage+threshold voltage−(Vos/2)" (Vdd+Vth−(Vos/2)), and then gradually decreases to the first threshold voltage Vth−(Vos/2) during a first period T1+ΔTe.

Subsequently, when the first clock signal CLK transitions to the high level, the first voltage Vc1 immediately falls to "negative power supply voltage+threshold voltage−(Vos/2)" (−Vdd+Vth−(Vos/2)), and then gradually increases to the first threshold voltage Vth−(Vos/2) during a second period T2−ΔTe.

Also, when the first clock signal CLK has a high level, the second voltage Vc2 gradually decreases to the second threshold voltage Vth+(Vos/2), and when the first clock signal CLK transitions to the low level, the second voltage Vc2 immediately falls to "negative power supply voltage+threshold voltage+(Vos/2)" (−Vdd+Vth+(Vos/2)), and then gradually increases to the second threshold voltage Vth+(Vos/2) during the first period T1+ΔTe.

Subsequently, when the first clock signal CLK transitions to the high level, the second voltage Vc2 immediately rises to "power supply voltage+threshold voltage+(Vos/2)" (Vdd+Vth+(Vos/2)), and then gradually decreases to the second threshold voltage Vth (Vos/2) during the second period T2−ΔTe.

The operation for one cycle (T=(T1+ΔTe)+(T2−ΔTe) as described above may be repeatedly performed, and in this case, the change ΔV of each of the first voltage Vc1 and the second voltage Vc2 is 2Vdd.

Therefore, it can be seen that even when the inverter circuit 400 has an offset voltage Vos, the change ΔV of each of the first voltage Vc1 and the second voltage Vc2 is the same as when there the inverter circuit 400 does not have an offset voltage Vos, and therefore it can be seen that an increase in an amount of jitter may be prevented.

For example, one cycle when the inverter circuit 400 does not have an offset voltage Vos may be the same as one cycle when the inverter circuit 400 has an offset voltage Vos, but the configuration of one cycle is not limited thereto.

Figure 10:
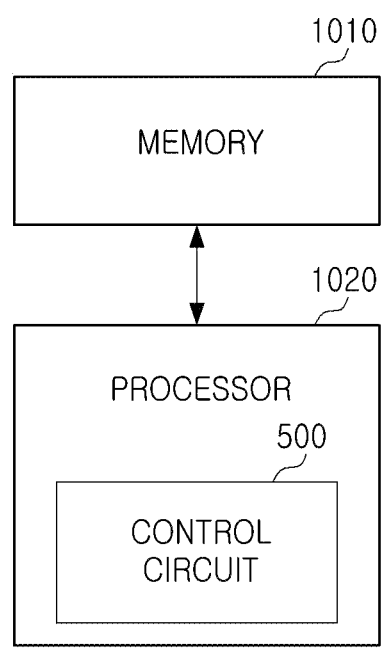
FIG. 10 is a block diagram illustrating an example of the control circuit of FIGS. 2 to 4.

FIG. 10 is a block diagram illustrating an example of the control circuit of FIGS. 2 to 4.

Referring to FIG. 10, a memory 1010 stores instructions that, when executed by a processor 1020, cause the processor 1020 to perform the functions of the control circuit 500 in FIGS. 2 to 4. Thus, the processor 1020 includes the control circuit 500.

The control circuit 500 in FIGS. 2 to 4 that perform the operations described in this application is implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, transistors, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

Instructions or software to control computing hardware, for example, one or more processors or computers, to implement the hardware components as described above may be written as computer programs, code segments, instructions or any combination thereof, for individually or collectively instructing or configuring the one or more processors or computers to operate as a machine or special-purpose computer to perform the operations that are performed by the hardware components as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the description of the operations that are performed by the hardware components as described above.

The instructions or software to control computing hardware, for example, one or more processors or computers, to implement the hardware components as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

The examples of an oscillation circuit described above are insensitive to temperature changes without needing a separate temperature compensation circuit, and are advantageous for miniaturization, and are therefore suitable for use in an autofocusing (AF) or optical image stabilization (OIS) circuit of a mobile phone camera module, and also have an improved jitter performance.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An oscillator circuit comprising:
an initial level setting circuit configured to operate in an on-state during an initial operation of the oscillator circuit to supply a first level voltage to a first node and a second level voltage to a second node;
a switching circuit configured to connect a power supply voltage terminal and a ground terminal to the first node or the second node in response to a first clock signal and a second clock signal having different phases after the initial operation of the oscillator circuit;
a signal generation circuit connected between the first node and the second node and configured to perform a charging operation and a discharging operation based on a potential difference between the first node and the second node, and generate a first voltage and a second voltage determined by the charging operation and the discharging operation; and
an inverter circuit configured to generate the first clock signal based on the first voltage, and generate the second clock signal based on the second voltage.

2. The oscillator circuit of claim 1, wherein the initial level setting circuit is further configured to operate in an off-state after the initial operation of the oscillator circuit to not supply the first level voltage to the first node and not supply the second level voltage to the second node.

3. The oscillator circuit of claim 1, wherein the initial level setting circuit comprises:
a first initial level setting unit configured to operate in an on-state during the initial operation of the oscillator circuit to supply the first level voltage to the first node; and
a second initial level setting unit configured to operate in an on-state during the initial operation of the oscillator circuit to supply the second level voltage to the second node.

4. The oscillator circuit of claim 1, wherein the switching circuit comprises:
a first switch configured to alternately connect the power supply voltage terminal to the first node and the second node in response to the first clock signal; and
a second switch configured to alternately connect the ground terminal to the second node and the first node in response to the second clock signal.

5. The oscillator circuit of claim 4, wherein the first switch and the second switch are further configured so that the first switch connects the power supply voltage terminal to the first node while the second switch connects the ground terminal to the second node, and the first switch connects the ground terminal to the second node while the second switch connects the power supply voltage terminal to the first node.

6. The oscillator circuit of claim 1, wherein the signal generation circuit comprises:
a first RC circuit comprising a first resistor and a first capacitor connected in series between the first node and the second node to perform a charging operation and a discharging operation based on the potential difference between the first node and the second node, and output the first voltage from an intermediate connection node between the first resistor and the first capacitor; and
a second RC circuit comprising a second capacitor and a second resistor connected in series between the first node and the second node to perform a charging operation and a discharging operation based on the potential difference between the first node and the second node, and output the second voltage from an intermediate connection node between the second capacitor and the second resistor.

7. The oscillator circuit of claim 6, wherein a time constant of the first resistor and the first capacitor of the first RC circuit determines an oscillation frequency of the first clock signal, and
a time constant of the second capacitor and the second resistor of the second RC circuit determines an oscillation frequency of the second clock signal.

8. The oscillator circuit of claim 1, wherein the inverter circuit comprises:
a first inverter configured to generate the first clock signal by inverting the first voltage; and
a second inverter configured to generate the second clock signal by inverting the second voltage.

9. The oscillator circuit of claim 8, wherein the first inverter is further configured to generate the first clock signal by inverting the first voltage based on a first threshold voltage,
the second inverter is further configured to generate the second clock signal by inverting the second voltage based on a second threshold voltage different from the first threshold voltage,
the first threshold voltage causes the first clock signal to have an on-duty ratio of less than 50%, and
the second threshold voltage causes the second clock signal to have an on-duty ratio of greater than 50%.

10. An oscillator circuit comprising:
an initial level setting circuit configured to operate in an on-state in response to a control signal during an initial operation of the oscillator circuit to supply a first level voltage to a first node and a second level voltage to a second node;
a switching circuit configured to connect a power supply voltage terminal and a ground terminal to the first node or the second node in response to a first clock signal and a second clock signal having different phases after the initial operation of the oscillation circuit;
a signal generation circuit connected between the first node and the second node and configured to perform a charging operation and a discharging operation based on a potential difference between the first node and the second node, and generate a first voltage and a second voltage determined by the charging operation and the discharging operation;
an inverter circuit configured to generate the first clock signal based on the first voltage, and generate the second clock signal based on the second voltage; and
a control circuit configured to generate the control signal to control the initial level setting circuit to operate in the on-state during the initial operation of the oscillator circuit.

11. The oscillator circuit of claim 10, wherein the initial level setting circuit is further configured to operate in an off-state in response to the control signal after the initial operation of the oscillator circuit to not supply the first level voltage to the first node and not supply the second level voltage to the second node, and
the control circuit is further configured to generate the control signal to control the initial level setting circuit to operate in the off-state after the initial operation of the oscillator circuit.

12. The oscillator circuit of claim 10, wherein the initial level setting circuit comprises:
a first initial level setting unit configured to operate in an on-state during the initial operation of the oscillator circuit to supply the first level voltage to the first node; and
a second initial level setting unit configured to operate in an on-state during the initial operation of the oscillator circuit to supply the second level voltage to the second node.

13. The oscillator circuit of claim 10, wherein the switching circuit comprises:
a first switch configured to alternately connect the power supply voltage terminal to the first node and the second node in response to the first clock signal; and
a second switch configured to alternately connect the ground terminal to the second node and the first node in response to the second clock signal.

14. The oscillator circuit of claim 13, wherein the first switch and the second switch are further configured so that the first switch connects the power supply voltage terminal to the first node while the second switch connects the ground terminal to the second node, and the first switch connects the ground terminal to the second node while the second switch connects the power supply voltage terminal to the first node.

15. The oscillator circuit of claim 10, wherein the signal generation circuit comprises:
   a first RC circuit comprising a first resistor and a first capacitor connected in series between the first node and the second node to perform a charging operation and a discharging operation based on a potential difference between the first node and the second node, and output the first voltage from an intermediate connection node between the first resistor and the first capacitor; and
   a second RC circuit comprising a second capacitor and a second resistor connected in series between the first node and the second node to perform a charging operation and a discharging operation based on the potential difference between the first node and the second node, and output the second voltage from an intermediate connection node between the second capacitor and the second resistor.

16. The oscillator circuit of claim 15, wherein a time constant of the first resistor and the first capacitor of the first RC circuit determines an oscillation frequency of the first clock signal, and
   a time constant of the second capacitor and the second resistor of the second RC circuit determines an oscillation frequency of the second clock signal.

17. The oscillator circuit of claim 10, wherein the inverter circuit comprises:
   a first inverter configured to generate the first clock signal by inverting the first voltage; and
   a second inverter configured to generate the second clock signal by inverting the second voltage.

18. The oscillator circuit of claim 17, wherein the first inverter is further configured to generate the first clock signal by inverting the first voltage based on a first threshold voltage,
   the second inverter is further configured to generate the second clock signal by inverting the second voltage based on a second threshold voltage different from the first threshold voltage,
   the first threshold voltage causes the first clock signal to have an on-duty ratio of less than 50%, and
   the second threshold voltage causes the second clock signal to have an on-duty ratio of greater than 50%.

19. An oscillator circuit comprising:
   an initial level setting circuit configured to supply a first level voltage to a first node and a second level voltage to a second node during an initial operation of the oscillator circuit;
   a switching circuit configured to periodically switch between a first configuration in which a power supply voltage terminal is connected to the first node and a ground terminal is connected to the second node and a second configuration in which the power supply terminal is connected to the second node and the ground terminal is connected to the first node in response to a first clock signal and a second clock signal having different phases after the initial operation of the oscillator circuit;
   a signal generation circuit connected between the first node and the second node and configured to generate a first voltage and a second voltage that vary over time based on a potential difference between the first node and the second node; and
   an inverter circuit configured to generate the first clock signal based on the first voltage, and generate the second clock signal based on the second voltage.

20. The oscillation circuit of claim 19, wherein the initial level setting circuit is further configured not to supply any voltage to the first node and the second node after the initial operation of the oscillator circuit, and
   the switching circuit comprises:
      a first switch configured to alternate between connecting the power supply voltage terminal to the first node and connecting the power supply voltage terminal to the second node in response to the first clock signal after the initial operation of the oscillator circuit; and
      a second switch configured to alternate between connecting the ground terminal to the second node while the first switch is connecting the power supply voltage terminal to the first node and connecting the ground terminal to the first node while the first switch is connecting the power supply voltage terminal to the second node in response to the second clock signal after the initial operation of the oscillator circuit.

21. The oscillator circuit of claim 19, wherein the signal generation circuit is further configured to generate the first voltage and the second voltage so that the first voltage and the second voltage vary over time in opposite directions.

22. The oscillator circuit of claim 19, wherein the signal generation circuit comprises:
   a first RC circuit comprising a first resistor and a first capacitor connected in series at a first intermediate connection node from which the first voltage is output with the first resistor being connected to the first node and the first capacitor being connected to the second node so the first voltage increases over time based on the potential difference between the first node and the second node while the switching circuit is in the first configuration, and decreases over time based on the potential difference between the first node and the second node while the switching circuit is in the second configuration; and
   a second RC circuit comprising a second capacitor and a second resistor connected in series at a second intermediate node between the first node and the second node from which the second voltage is output with the second capacitor being connected to the first node and the second resistor being connected to the second node so the second voltage decreases over time based on the potential difference between the first node and the second node while the switching circuit is in the first configuration, and increases over time based on the potential difference between the first node and the second node while the switching circuit is in the second configuration.

23. The oscillator circuit of claim 19, wherein the inverter circuit comprises:
   a first inverter configured to generate the first clock signal by inverting the first voltage based on a threshold voltage Vth, and
   a second inverter configured to generate the second clock signal by inverting the second voltage based on the threshold voltage Vth.

24. The oscillator circuit of claim 23, wherein the threshold voltage Vth causes the first clock signal and the second clock signal to have an on-duty ratio of 50%.

25. The oscillator circuit of claim 19, wherein the inverter circuit comprises:

a first inverter having a threshold voltage Vth and being configured to generate the first clock signal by inverting the first voltage based on a first threshold voltage Vth−(Vos/2), where Vos is an offset voltage of the inverter circuit; and a second inverter having the threshold voltage Vth and being configured to generate the second clock signal by inverting the second voltage based on a second threshold voltage Vth+(Vos/2).

26. The oscillator circuit of claim 25, wherein the first threshold voltage Vth−(Vos/2) causes the first clock signal to have an on-duty ratio of less than 50%, and the second threshold voltage Vth+(Vos/2) causes the second clock signal to have an on-duty ratio of greater than 50%.

27. An oscillator circuit comprising:

an initial level setting circuit configured to supply a first level voltage to a first node and a second level voltage to a second node during an initial operation of the oscillator circuit;

a switching circuit configured to periodically switch between a first configuration in which a power supply voltage terminal is connected to the first node and a ground terminal is connected to the second node and a second configuration in which the power supply terminal is connected to the second node and the ground terminal is connected to the first node in response to a first clock signal and a second clock signal having different phases after the initial operation of the oscillator circuit;

a signal generation circuit connected between the first node and the second node and configured to generate a first voltage and a second voltage based on a potential difference between the first node and the second node; and an inverter circuit configured to generate the first clock signal based on the first voltage, and generate the second clock signal based on the second voltage, wherein the first voltage and the second voltage vary over time by a fixed amount regardless of whether the inverter circuit has an offset voltage.

28. The oscillator circuit of claim 27, wherein the inverter circuit does not have an offset voltage, and comprises:

a first inverter configured to generate the first clock signal by inverting the first voltage based on a threshold voltage Vth, and a second inverter configured to generate the second clock signal by inverting the second voltage based on the threshold voltage Vth.

29. The oscillator circuit of claim 27, wherein the inverter circuit has an offset voltage Vos and comprises:

a first inverter having a threshold voltage Vth and being configured to generate the first clock signal by inverting the first voltage based on a first threshold voltage Vth−(Vos/2); and a second inverter having the threshold voltage Vth and being configured to generate the second clock signal by inverting the second voltage based on a second threshold voltage Vth+(Vos/2).

30. The oscillator circuit of claim 27, wherein the power supply terminal is configured to receive a power supply voltage, the ground terminal is configured to receive a ground potential, and the first voltage and the second voltage vary over time by a fixed amount equal to twice the power supply voltage regardless of whether the inverter circuit has an offset voltage.

* * * * *